(12) United States Patent
Hirasaki (10) Patent No.: US 11,545,550 B2
(45) Date of Patent: Jan. 3, 2023

(54) SEMICONDUCTOR DEVICE AND METHOD OF MANUFACTURING SEMICONDUCTOR DEVICE

(71) Applicant: SUMITOMO ELECTRIC INDUSTRIES, LTD., Osaka (JP)

(72) Inventor: Takahide Hirasaki, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 107 days.

(21) Appl. No.: 17/138,094

(22) Filed: Dec. 30, 2020

(65) Prior Publication Data

US 2021/0217853 A1 Jul. 15, 2021

(30) Foreign Application Priority Data

Jan. 10, 2020 (JP) .............................. JP2020-002772

(51) Int. Cl.
| | | |
|---|---|---|
| *H01L 29/20* | (2006.01) | |
| *H01L 29/66* | (2006.01) | |
| *H01L 21/02* | (2006.01) | |
| *H01L 29/778* | (2006.01) | |

(52) U.S. Cl.
CPC ...... *H01L 29/2003* (2013.01); *H01L 21/0254* (2013.01); *H01L 21/02126* (2013.01); *H01L 29/66462* (2013.01); *H01L 29/7786* (2013.01)

(58) Field of Classification Search
None
See application file for complete search history.

(56) References Cited

U.S. PATENT DOCUMENTS

| | | | |
|---|---|---|---|
| 2010/0317164 A1 | 12/2010 | Komatani | |
| 2021/0104395 A1* | 4/2021 | Yamamura | .......... H01L 29/7787 |
| 2021/0217853 A1* | 7/2021 | Hirasaki | .............. H01L 21/3065 |

FOREIGN PATENT DOCUMENTS

JP          2009-200306          9/2009

* cited by examiner

*Primary Examiner* — Jack S Chen
(74) *Attorney, Agent, or Firm* — Smith, Gambrell & Russell, LLP.

(57) ABSTRACT

A semiconductor device includes a nitride semiconductor layer, an insulating layer provided on a surface of the nitride semiconductor layer, and a metal electrode in contact with the surface through an opening penetrating the insulating layer. The insulating layer includes a first SiN film having a concentration of chlorine (Cl) of $1 \times 10^{20}$ [atoms/cm$^3$] or more and a thickness of 30 nm or less, and a second SiN film having a concentration of chlorine (Cl) of $1 \times 10^{19}$ [atoms/cm$^3$] or less.

7 Claims, 8 Drawing Sheets

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2020-002772, filed on Jan. 10, 2020, the entire contents of which are incorporated herein by reference.

TECHNICAL FIELD

The present disclosure relates to a semiconductor device and a method of manufacturing a semiconductor device.

BACKGROUND

Japanese Unexamined Patent Publication No. 2009-200306 discloses a method of manufacturing a semiconductor device. In this manufacturing method, a GaN traveling layer, a GaN electron supply layer, and a GaN cap layer are sequentially grown on a substrate, and a first silicon nitride film and a second silicon nitride film are sequentially formed on the GaN cap layer using a plasma-enhanced chemical vapor deposition (PECVD) method. Then, the GaN cap layer is exposed using an exposure method and an etching method, a source electrode and a drain electrode are formed on the exposed GaN cap layer, and a gate electrode is formed between the source electrode and the drain electrode on the GaN cap layer.

SUMMARY

A semiconductor device of the present disclosure includes a nitride semiconductor layer, an insulating layer provided on a surface of the nitride semiconductor layer, and a metal electrode in contact with the surface through an opening penetrating the insulating layer. The insulating layer includes a first SiN film having a concentration of chlorine (Cl) of $1\times10^{20}$ [atoms/cm$^3$] or more and a thickness of 30 nm or less, and a second SiN film having a concentration of chlorine (Cl) of $1\times10^{19}$ [atoms/cm$^3$] or less.

A method of manufacturing a semiconductor device of the present disclosure includes forming an insulating layer including a first SiN film and a second SiN film on the first SiN film on a surface of a nitride semiconductor layer using a CVD method, forming an opening to expose the surface in the insulating layer by reactive ion etching using a fluorine-based gas, and forming a metal electrode in contact with the surface through the opening. In the forming the insulating layer on the surface, a raw material gas that contains a silicon (Si)- and chlorine (Cl)-containing compound gas and ammonia (NH$_3$) is used to form the first SiN film and the second SiN film, a flow rate ratio (F1/F2) of a flow rate (F1) of the compound gas to a flow rate (F2) of the ammonia is set to 1/4 or more and 10 or less when the first SiN film is formed, and the flow rate ratio (F1/F2) is set to 1/10 or less when the second SiN film is formed.

DETAILED DESCRIPTION

Problems to be Solved by Present Disclosure

In recent years, semiconductor devices using a nitride semiconductor such as GaN-based semiconductors have been developed. When a semiconductor device is manufactured using a nitride semiconductor, a silicon nitride (SiN) film may be formed on a surface of a nitride semiconductor layer, and an opening for forming a gate electrode may be formed in the SiN film. This opening is formed, for example, using highly anisotropic dry etching. This dry etching is carried out by applying a bias voltage to plasma of an etching gas in a stacking direction of the nitride semiconductor layer.

However, in a case in which the opening is formed in the SiN film using such dry etching, the plasma of the etching gas collides with the surface of the nitride semiconductor layer in a high energy state due to acceleration by the bias voltage, which damages flatness of the surface. If the flatness of the surface is damaged, a Schottky barrier formed between the surface and the gate electrode will be in a state different from the ideal. As a result, a leakage current may increase.

Effects of Present Disclosure

According to the semiconductor device and the method of manufacturing a semiconductor device of the present disclosure, it is possible to suppress the increase in the leakage current of the semiconductor device by suppressing the decrease in the flatness of the surface of the nitride semiconductor layer.

Description Of Embodiments of Present Disclosure

First, the contents of the embodiments of the present disclosure will be listed and described. A semiconductor device according to an embodiment of the present disclosure includes a nitride semiconductor layer, an insulating layer provided on a surface of the nitride semiconductor layer, and a metal electrode in contact with the surface through an opening penetrating the insulating layer. The insulating layer includes a first SiN film having a concentration of chlorine (Cl) of $1\times10^{20}$ [atoms/cm$^3$] or more and a thickness of 30 nm or less, and a second SiN film having a concentration of chlorine (Cl) of $1\times10^{19}$ [atoms/cm$^3$] or less.

In this semiconductor device, the insulating layer is provided on the surface of the nitride semiconductor layer, and the opening penetrating the insulating layer is formed in the insulating layer. When the semiconductor device is manufactured, this opening can be formed in the insulating layer by, for example, dry etching. Here, the insulating layer includes a first SiN film having a chlorine concentration of $1\times10^{20}$ [atoms/cm$^3$] or more. When the dry etching reaches the first SiN film having a chlorine concentration of $1\times10^{20}$ [atoms/cm$^3$] or more, a small amount of chlorine is released from the first SiN film into the opening. The released chlorine causes a chemical reaction with the surface of the nitride semiconductor layer exposed from the opening. As a result, chemical etching with chlorine proceeds on the surface. The chemical etching preferentially reacts with a rough portion (that is, an uneven portion) of the surface. By the progress of this chemical etching, the surface can be flattened at an atomic level. Therefore, the decrease in the flatness of the surface due to the dry etching can be suppressed by the chemical etching. By suppressing the decrease in the flatness of the surface, the Schottky barrier formed between the surface and the metal electrode can be brought close to the ideal state. As a result, an increase in the leakage current can be suppressed. Further, since the insulating layer includes the second SiN film having a chlorine concentration of $1\times10^{19}$ [atoms/cm$^3$] or less, it is possible to suppress a situation in which chlorine is excessively contained as an impurity in the insulating layer. Accordingly, it is possible to suppress a decrease in the insulating property of the insulating layer and to suppress an increase in the leakage current through the insulating layer.

The first SiN film may be located closer to the surface of the nitride semiconductor layer than the second SiN film. In this case, the first SiN film having a chlorine concentration of $1\times10^{20}$ [atoms/cm$^3$] or more is located on the surface side of the nitride semiconductor layer as compared with the second SiN film having a chlorine concentration of $1\times10^{19}$ [atoms/cm$^3$] or less. Accordingly, chlorine released from the first SiN film can be more reliably caused to act on the surface, and the above-mentioned effect of suppressing a decrease in the flatness of the surface can be maintained.

A method of manufacturing a semiconductor device according to an embodiment of the present disclosure includes forming an insulating layer including a first SiN film and a second SiN film on the first SiN film on a surface of a nitride semiconductor layer using a CVD method, forming an opening to expose the surface in the insulating layer by reactive ion etching using a fluorine-based gas, and forming a metal electrode in contact with the surface through the opening. In the forming the insulating layer on the surface, a raw material gas that contains a silicon (Si)- and chlorine (Cl)-containing compound gas and ammonia (NH$_3$) is used to form the first SiN film and the second SiN film, a flow rate ratio (F1/F2) of a flow rate (F1) of the compound gas to a flow rate (F2) of the ammonia is set to 1/4 or more and 10 or less when the first SiN film is formed, and the flow rate ratio (F1/F2) is set to 1/10 or less when the second SiN film is formed.

In the method of manufacturing a semiconductor device, the flow rate ratio (F1/F2) of the flow rate (F1) of the compound gas to the flow rate (F2) of the ammonia is set to 1/4 or more and 10 or less when the first SiN film is formed. In this way, it is possible to increase the amount of chlorine contained in the raw material gas by increasing the flow rate (F1) of the compound gas containing chlorine. Accordingly, the first SiN film having a chlorine concentration of $1\times10^{20}$ [atoms/cm$^3$] or more can be formed. By forming the first SiN film on the surface of the nitride semiconductor layer, it is possible to suppress a decrease in the flatness of the surface as described above. As a result, an increase in the leakage current can be suppressed. Further, in the forming the insulating layer on the surface, the amount of chlorine contained in the raw material gas can be reduced by reducing the flow rate (F1) of the compound gas containing chlorine when the second SiN film is formed on the first SiN film after the first SiN film is formed on the surface. Accordingly, the second SiN film having a chlorine concentration of $1\times10^{19}$ [atoms/cm$^3$] or less can be formed. Since the insulating layer includes the second SiN film having a chlorine concentration of $1\times10^{19}$ [atoms/cm$^3$] or less, it is possible to suppress a situation in which chlorine is excessively contained as an impurity in the insulating layer. Accordingly, it is possible to suppress a decrease in the insulating property of the insulating layer and to suppress an increase in the leakage current through the insulating layer. Further, since the second SiN film is formed on the first SiN film, the first SiN film having a chlorine concentration of $1\times10^{20}$ [atoms/cm$^3$] or more is located on the surface side of the nitride semiconductor layer as compared with the second SiN film having a chlorine concentration of $1\times10^{19}$ [atoms/cm$^3$] or less. Accordingly, chlorine released from the first SiN film can be more reliably caused to act on the surface, and the above-mentioned effect of suppressing a decrease in the flatness of the surface can be maintained.

In the forming the opening in the insulating layer, the fluorine-based gas may be sulfur hexafluoride (SF$_6$) or methane tetrafluoride (CF$_4$). In this case, the opening can be suitably formed in the insulating layer.

Detailed Description of Embodiments of Present Disclosure

Specific examples of the semiconductor device and the method of manufacturing a semiconductor device according to the embodiments of the present disclosure will be described below with reference to the drawings. The present disclosure is not limited to these examples, but is indicated by the claims and is intended to include all modifications within the meaning and scope of the claims. In the following description, the same elements will be designated by the same reference numerals in the description of the drawings, and duplicate description will be omitted as appropriate.

Figure 1:
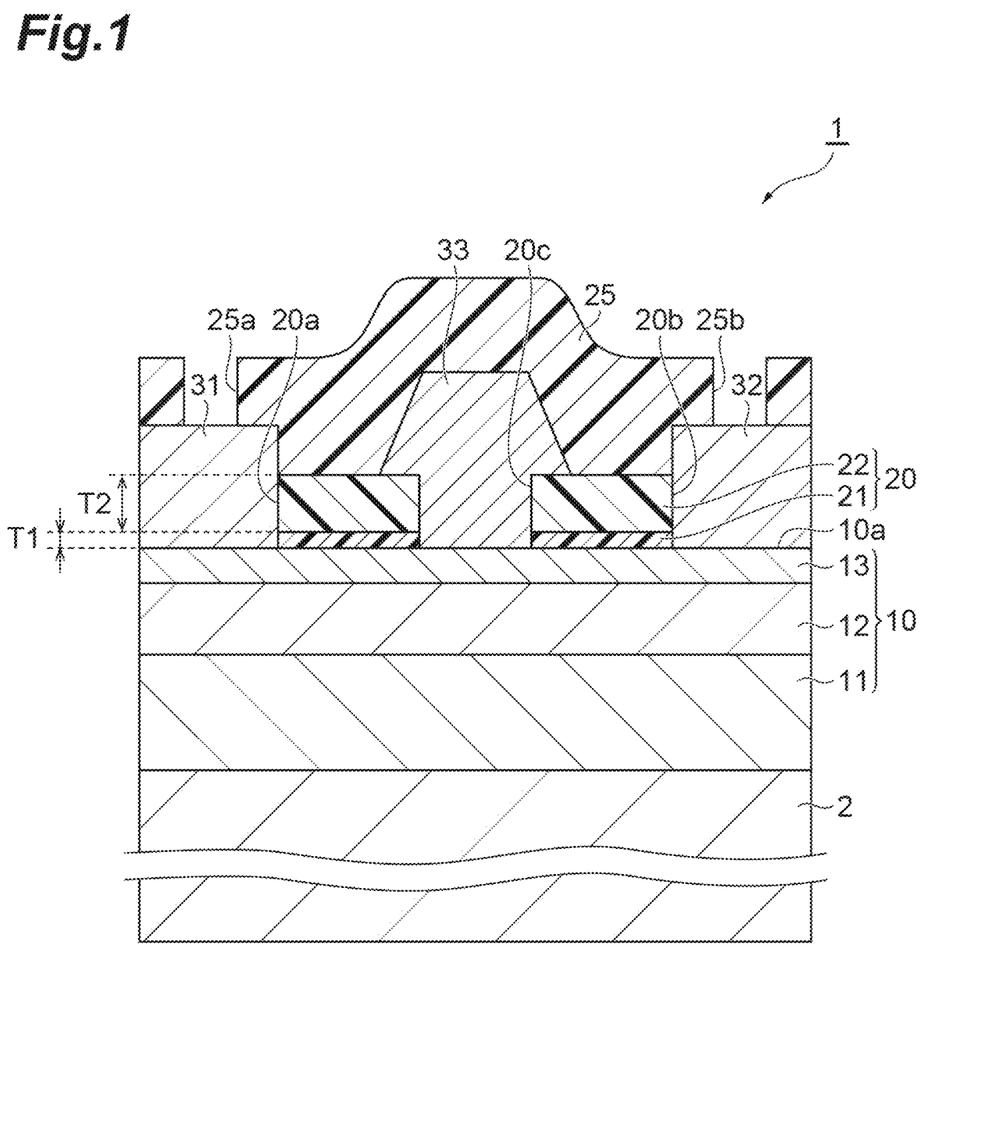
FIG. 1 is a cross-sectional view showing a field effect transistor as an example of a semiconductor device according to an embodiment.

FIG. 1 is a cross-sectional view showing a field effect transistor (hereinafter, simply referred to as a "transistor") 1 as an example of a semiconductor device according to the present embodiment. The transistor 1 according to the present embodiment is a high electron mobility transistor (HEMT). As shown in FIG. 1, the transistor 1 includes a substrate 2, a nitride semiconductor layer 10, insulating layers 20 and 25, a source electrode 31, a drain electrode 32, and a gate electrode 33. The nitride semiconductor layer 10 is an epitaxial layer formed on the substrate 2, and mainly contains a nitride semiconductor. The nitride semiconductor layer 10 includes a channel layer 11, a barrier layer 12, and a cap layer 13 in order from the substrate 2 side. A 2-dimensional electron gas (2DEG) is generated in the channel layer 11 near an interface between the channel layer 11 and the barrier layer 12. Accordingly, a channel region is formed in the channel layer 11.

The substrate 2 is a substrate for crystal growth. Examples of the substrate 2 include a SiC substrate, a GaN substrate, and a sapphire (Al$_2$O$_3$) substrate. In an example, the substrate 2 is a SiC substrate. The channel layer 11 is a semiconductor layer epitaxially grown on the substrate 2. The channel layer 11 is formed of a nitride semiconductor, and is, for example, a GaN layer. The thickness of the channel layer 11 is, for example, 400 nm or more and 2000 nm or less. The barrier layer 12 is a semiconductor layer epitaxially grown on the channel layer 11. The barrier layer 12 is formed of a nitride semiconductor having a higher electron affinity than the channel layer 11. The barrier layer 12 is, for example, an AlGaN layer, an InAlN layer, or an InAlGaN layer. The barrier layer 12 may exhibit n-type conductivity. The thickness of the barrier layer 12 is, for example, 5 nm or more and 30 nm or less.

The cap layer 13 is a semiconductor layer epitaxially grown on the barrier layer 12. The cap layer 13 is formed of a nitride semiconductor, and is, for example, a GaN layer. The cap layer 13 may contain an impurity. For example, the cap layer 13 may be an n-type GaN layer. The thickness of the cap layer 13 is, for example, 1 nm or more and 5 nm or less. A surface of the cap layer 13 forms a surface 10a of the nitride semiconductor layer 10. The surface 10a is a surface located on the insulating layer 20 side (that is, the side opposite to the substrate 2) in a stacking direction of the nitride semiconductor layer 10.

The insulating layer 20 is an insulating protective layer provided on the surface 10a of the nitride semiconductor layer 10. The insulating layer 20 is formed using, for example, a low pressure chemical vapor deposition (LPCVD) method, as will be described later. The LPCVD method is a method of forming a dense film by lowering the film forming pressure and raising the film forming temperature.

The insulating layer 20 may be formed using a plasma CVD method. The insulating layer 20 includes a first SiN film 21 provided on the surface 10a of the nitride semiconductor layer 10 and a second SiN film 22 provided on the first SiN film 21. The first SiN film 21 is in contact with the surface 10a and covers the surface 10a. The first SiN film 21 is a chlorine-rich film containing a large amount of chlorine (Cl) as an impurity. The first SiN film 21 has a chlorine concentration of $1\times10^{20}$ [atoms/cm$^3$] or more. The chlorine concentration of the first SiN film 21 may be, for example, $1\times10^{20}$ [atoms/cm$^3$] or more and $1\times10^{21}$ [atoms/cm$^3$] or less. In an embodiment, the chlorine concentration of the first SiN film 21 is $1\times10^{21}$ [atoms/cm$^3$]. The refractive index of the first SiN film 21 is, for example, 2.3 or more and 2.4 or less with respect to a wavelength of 632 nm. The refractive index of the first SiN film 21 may be, for example, 2.25 or more and 2.5 or less with respect to a wavelength of 632 nm. The thickness of the first SiN film 21 is, for example, 5 nm or more and 20 nm or less. The thickness of the first SiN film 21 may be, for example, 1 nm or more and 30 nm or less.

The second SiN film 22 is provided on the surface 10a of the nitride semiconductor layer 10 through the first SiN film 21. That is, the second SiN film 22 is provided on the side opposite to the nitride semiconductor layer 10 with respect to the first SiN film 21 in the stacking direction of the nitride semiconductor layer 10. The second SiN film 22 is in contact with the first SiN film 21 and covers the first SiN film 21. The chlorine concentration of the second SiN film 22 is lower than the chlorine concentration of the first SiN film 21.

Specifically, the chlorine concentration of the second SiN film 22 is $1\times10^{19}$ [atoms/cm$^3$] or less. The chlorine concentration of the second SiN film 22 may be, for example, $1\times10^{15}$ [atoms/cm$^3$] or more and $1\times10^{19}$ [atoms/cm$^3$] or less. In an embodiment, the chlorine concentration of the second SiN film 22 is $1\times10^{19}$ [atoms/cm$^3$]. In the present embodiment, the chlorine concentration is measured, for example, by a secondary ion mass spectrometry (SIMS) method. A detection limit value of chlorine concentration measurement by the SIMS method is $1\times10^{15}$ [atoms/cm$^3$].

The refractive index of the second SiN film 22 is lower than the refractive index of the first SiN film 21. Specifically, the refractive index of the second SiN film 22 is, for example, 2.0 or more and less than 2.2 with respect to a wavelength of 632 nm. The refractive index of the second SiN film 22 may be, for example, 2.0 or less, or 1.8 or more and less than 2.25 with respect to a wavelength of 632 nm. The thickness of the second SiN film 22 is thicker than the thickness of the first SiN film 21. The thickness of the second SiN film 22 is, for example, 20 nm or more and 100 nm or less. The thickness of the second SiN film 22 may be, for example, 10 nm or more and 150 nm or less. The ratio (T2/T1) of the thickness (T2) of the second SiN film 22 to the thickness (T1) of the first SiN film 21 is, for example, 1 or more and 5 or less. The ratio (T2/T1) may be, for example, 1 or more and 20 or less.

A source opening 20a, a drain opening 20b, and a gate opening 20c are formed in the insulating layer 20. The openings 20a, 20b, and 20c penetrate the insulating layer 20 in the stacking direction of the nitride semiconductor layer 10. The surface 10a of the nitride semiconductor layer 10 is exposed in the openings 20a, 20b, and 20c. The source opening 20a and the drain opening 20b are aligned in one direction along the surface 10a. The gate opening 20c is provided between the source opening 20a and the drain opening 20b. The openings 20a, 20b, and 20c are formed by, for example, reactive ion etching (RIE) using a reactive gas containing fluorine (F) atoms (that is, a fluorine-based gas).

The source electrode 31 is provided on the surface 10a of the nitride semiconductor layer 10 and blocks the source opening 20a. The source electrode 31 forms ohmic contact with the surface 10a through the source opening 20a. The drain electrode 32 is provided on the surface 10a and blocks the drain opening 20b. The drain electrode 32 forms ohmic contact with the surface 10a through the drain opening 20b. Each of the source electrode 31 and the drain electrode 32 is an ohmic electrode, and is, for example, an alloy with a tantalum (Ta) layer, an aluminum (Al) layer, and a molybdenum (Mo) layer that overlap each other. A titanium (Ti) layer may be employed instead of the Ta layer.

The gate electrode 33 is an example of a metal electrode in the present embodiment. The gate electrode 33 is provided on the surface 10a of the nitride semiconductor layer 10 and is located between the source electrode 31 and the drain electrode 32. The gate electrode 33 blocks the gate opening 20c and is in contact with the surface 10a through the gate opening 20c. The gate electrode 33 includes a material that is in Schottky-contact with the surface 10a, and has, for example, a stacked structure of a nickel (Ni) layer and a gold (Au) layer. In this case, the Ni layer is in Schottky-contact with the surface 10a of the nitride semiconductor layer 10 (specifically, the surface of the cap layer 13).

The insulating layer 25 is provided on the insulating layer 20. The insulating layer 25 is a protective film that covers the gate electrode 33, and is in contact with the second SiN film 22 of the insulating layer 20. The insulating layer 25 is formed of an insulating material containing Si, and is, for example, a SiN film, a SiO$_2$ film, or a SiON film. The insulating layer 25 is formed on the insulating layer 20 using, for example, the LPCVD method or the plasma CVD method. A source opening 25a and a drain opening 25b are formed in the insulating layer 25. The openings 25a and 25b penetrate the insulating layer 25 in the stacking direction of the nitride semiconductor layer 10.

The source opening 25a is formed in a portion of the insulating layer 25 which covers the source electrode 31. The source electrode 31 is exposed in the source opening 25a. The source electrode 31 is in contact with a source electrode pad (not shown) through the source opening 25a. The drain opening 25b is formed in a portion of the insulating layer 25 which covers the drain electrode 32. The drain electrode 32 is exposed in the drain opening 25b. The drain electrode 32 is in contact with a drain electrode pad (not shown) through the drain opening 25b. The openings 25a and 25b are formed by, for example, RIE using a fluorine-based gas.

Figure 2A:
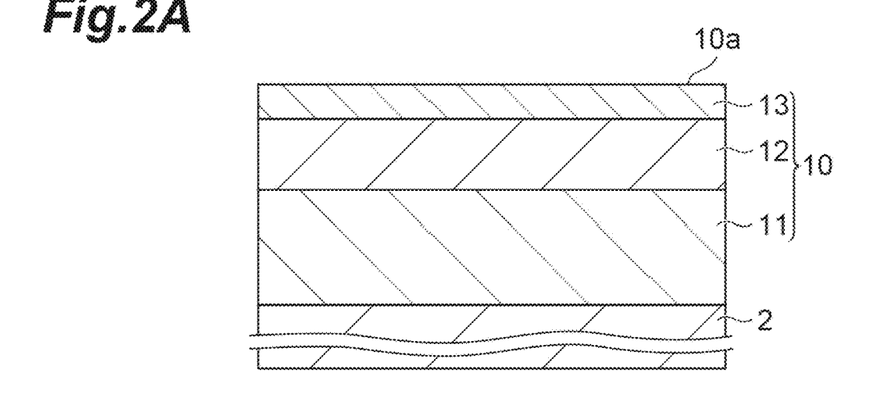
FIGS. 2A, 2B, and 2C are cross-sectional views each showing a manufacturing process of the field effect transistor shown in FIG. 1.

Next, an example of the method of manufacturing the transistor 1 according to the present embodiment will be described. FIGS. 2A, 2B, 2C, 3A, 3B, and 3C are cross-sectional views each showing a manufacturing process of the transistor 1. When the transistor 1 is manufactured, first, the nitride semiconductor layer 10 including the channel layer 11, the barrier layer 12, and the cap layer 13 is formed on the substrate 2 as shown in FIG. 2A Specifically, the channel layer 11, the barrier layer 12, and the cap layer 13 are epitaxially grown on the substrate 2 in order using a metal organic chemical vapor deposition (MOCVD) method.

Figure 2B:
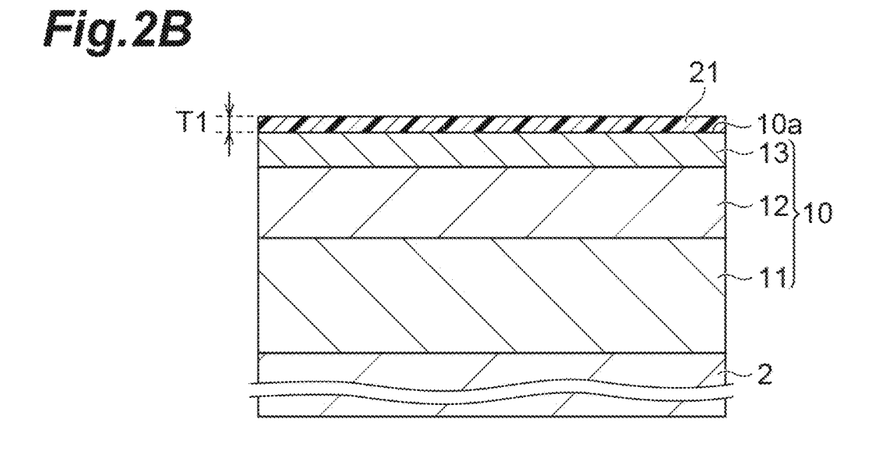
Figure 2C:
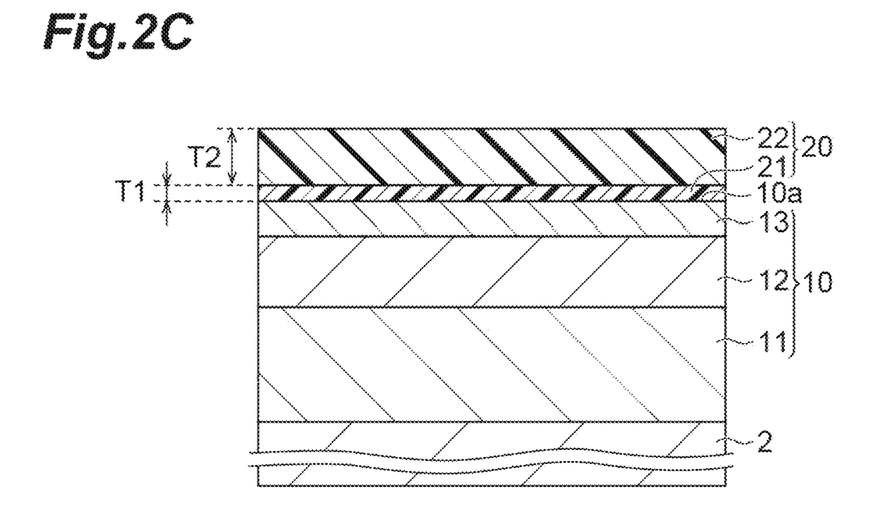

Subsequently, the insulating layer 20 is formed on the surface 10a of the nitride semiconductor layer 10 using the LPCVD method. Specifically, the first SiN film 21 of the insulating layer 20 is formed on the surface 10a of the nitride semiconductor layer 10 as shown in FIG. 2B. At this time, by controlling the film formation time of the first SiN film 21, the thickness (T1) of the first SiN film 21 is set to, for example, 5 nm or more and 20 nm or less. After that, the second SiN film 22 of the insulating layer 20 is formed on the first SiN film 21 as shown in FIG. 2C. At this time, by controlling the film formation time of the second SiN film 22, the thickness (T2) of the second SiN film 22 is set to, for example, 20 nm or more and 100 nm or less. In this way, the insulating layer 20 is formed on the surface 10a. The details of a method of forming the insulating layer 20 (the first SiN film 21 and the second SiN film 22) using the LPCVD method will be described later.

Subsequently, a source opening 20a and a drain opening 20b (see FIG. 1) are formed in the insulating layer 20 by selectively etching a part of the insulating layer 20. Specifically, a resist is applied onto the insulating layer 20, and an opening pattern having the same planar shape as the source opening 20a and the drain opening 20b is formed on the resist. Then, the dry etching of the insulating layer 20 is performed via the opening pattern. In the present embodiment, the dry etching is RIE using a fluorine-based gas.

The fluorine-based gas is, for example, methane tetrafluoride ($CF_4$), but may be sulfur hexafluoride ($SF_6$). When the fluorine-based gas is $CF_4$, a flow rate of the fluorine-based gas is set to, for example, 50 sccm, a high frequency power (RF power) is set to, for example, 100 W, a bias power is set to, for example, 10 W, and a reaction pressure is set to, for example, 0.4 Pa. 1 sccm represents 1 $cm^3$/min at 1 atm and 0° C. The etching time of the insulating layer 20 is set according to the thickness of the insulating layer 20 and the bias power. In practice, the over-etching time is added to the etching time. The over-etching time is set to 100% or less of the calculated etching time. In the present step, the source opening 20a and the drain opening 20b penetrating the insulating layer 20 are formed, and the surface 10a is exposed from the openings 20a and 20b.

Subsequently, the source electrode 31 is formed in the source opening 20a, and the drain electrode 32 is formed in the drain opening 20b. In this step, metal electrodes (for example, the Ta layer, the Al layer and the Mo layer) for the source electrode 31 and the drain electrode 32 are formed using lithography and lift-off After that, to make the source electrode 31 and the drain electrode 32 ohmic electrodes, each of the source electrode 31 and the drain electrode 32 is alloyed by heat treatment. The temperature of this heat treatment is, for example, 500° C. or higher and 600° C. or lower.

Figure 3A:
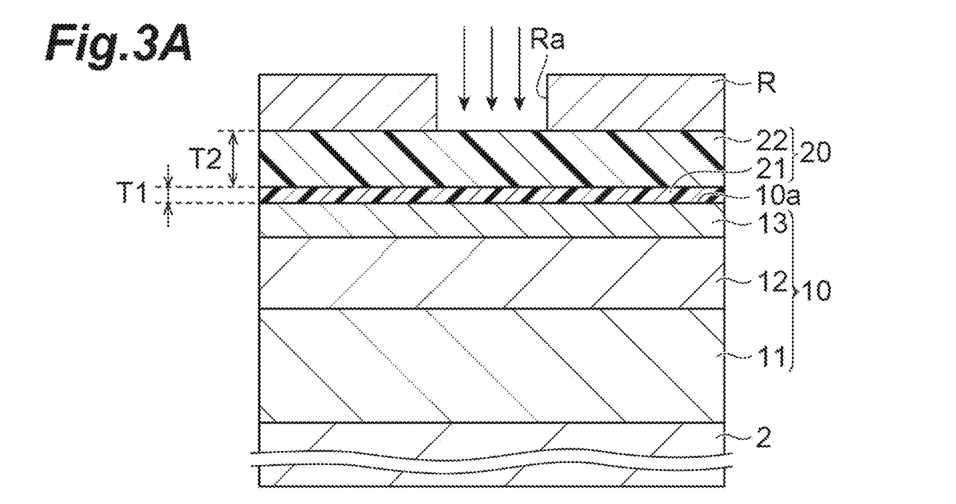
FIGS. 3A, 3B, and 3C are cross-sectional views each showing a manufacturing process of the field effect transistor shown in FIG. 1.
Figure 3B:
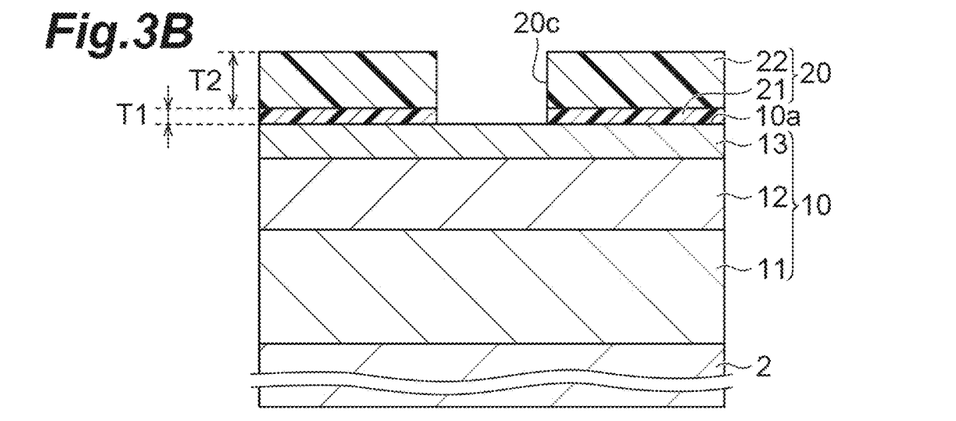

Subsequently, a resist R having an opening Ra is formed on the insulating layer 20 as shown in FIG. 3A. The opening Ra of the resist R is formed using lithography on a region where the gate opening 20c (see FIG. 1) is formed. After that, the insulating layer 20 is subjected to RIE using the resist R as a mask. With this RIE, the gate opening 20c is formed in the insulating layer 20 as shown in FIG. 3B.

The fluorine-based gas used for RIE is, for example, $CF_4$, but may be $SF_6$. When the fluorine-based gas is $CF_4$, a flow rate of the fluorine-based gas is set to, for example, 50 sccm, a high frequency power is set to, for example, 100 W, a bias power is set to, for example, 10 W, and a reaction pressure is set to, for example, 0.4 Pa. The etching time of the insulating layer 20 is set according to the thickness of the insulating layer 20 and the bias power. In practice, the over-etching time is added to the etching time. The over-etching time is set to 100% or less of the calculated etching time. In the present step, a gate opening 20c penetrating the insulating layer 20 is formed, and the surface 10a is exposed from the gate opening 20c. After that, the resist R is removed.

Figure 3C:
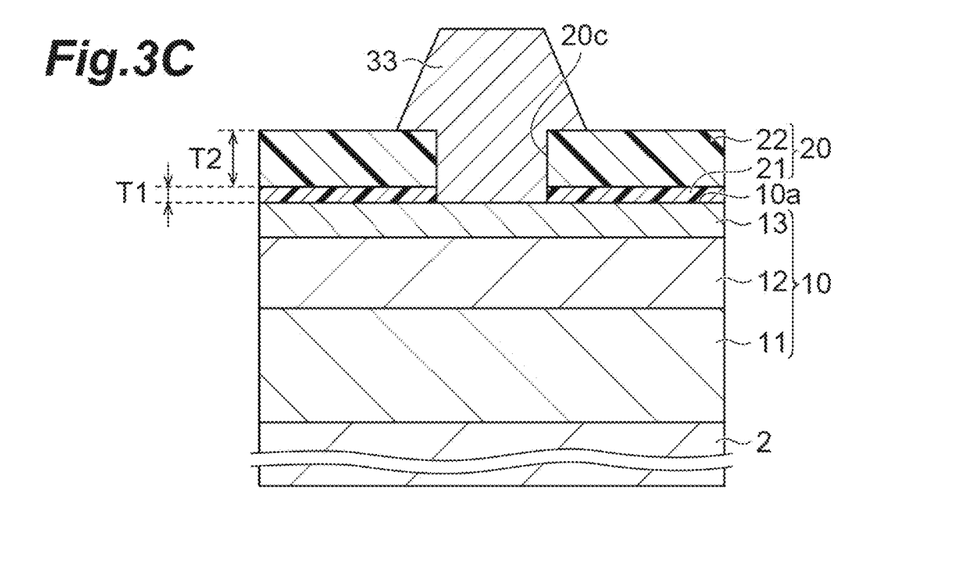

Subsequently, the gate electrode 33 that blocks the gate opening 20c is formed as shown in FIG. 3C. Specifically, a resist is applied onto the insulating layer 20, and an opening of the resist is formed on the gate opening 20c by lithography. After that, a metal electrode is deposited in the gate opening 20c and around the gate opening 20c through the opening of the resist. The deposition of the metal electrode is carried out by a vapor deposition method. After that, by removing the resist, a metal material deposited on the resist is lifted off. Accordingly, the gate electrode 33 is formed.

Subsequently, for example, the insulating layer 25 (see FIG. 1) is formed on the second SiN film 22 using the LPCVD method or the plasma CVD method, and the gate electrode 33 is covered with the insulating layer 25. At this time, for example, monosilane ($SiH_4$), dichlorosilane ($SiH_2Cl_2$), and ammonia ($NH_3$) are used as the raw material gas. After that, the openings 25a and 25b are formed in the insulating layer 25 by RIE using, for example, a fluorine-based gas, and the electrodes 31 and 32 are exposed from the openings 25a and 25b. Through the above steps, the transistor 1 shown in FIG. 1 is manufactured.

Figure 4:
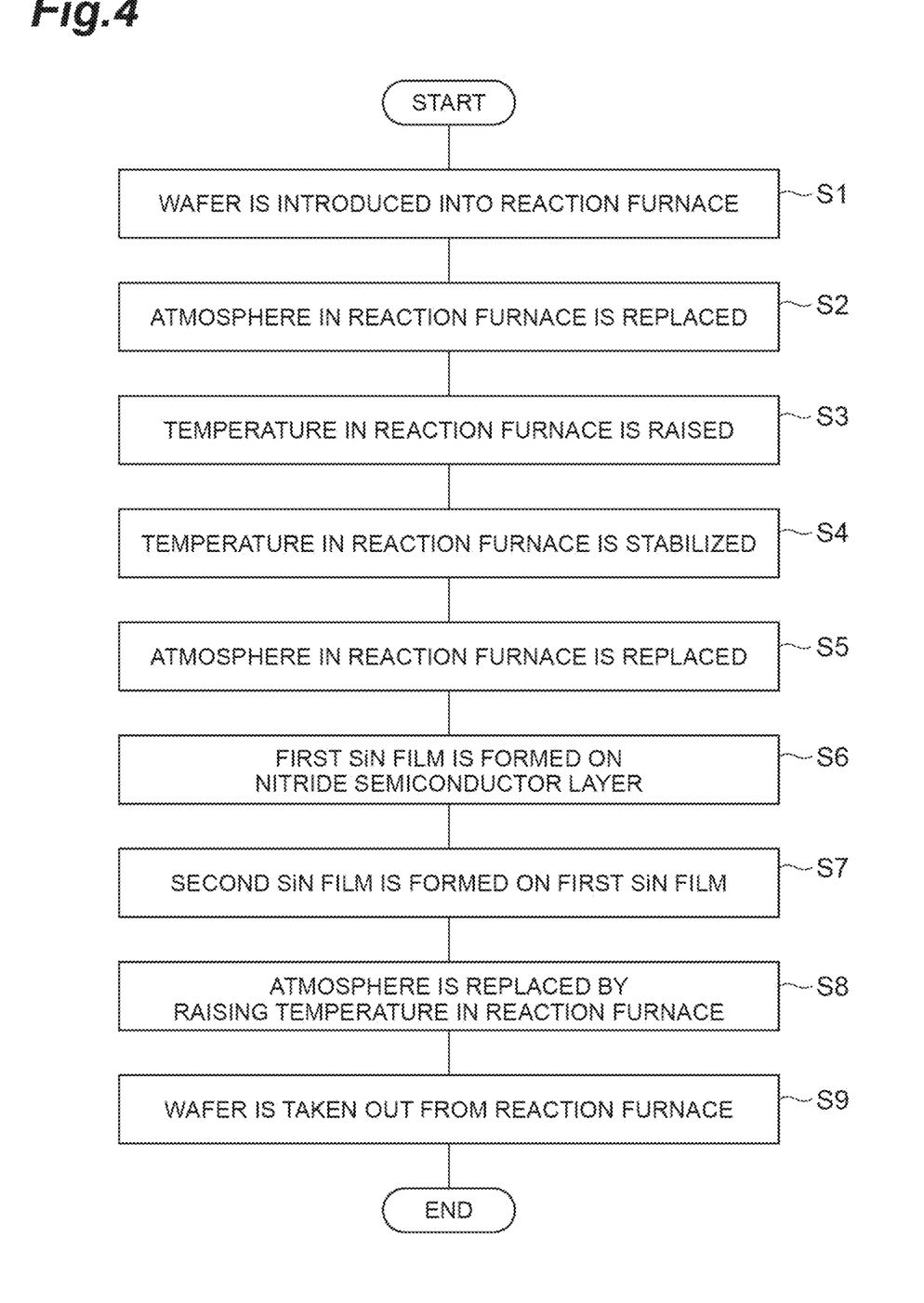
FIG. 4 is a flowchart showing an example of a method of forming an insulating layer using an LP CVD method.
Figure 5A:
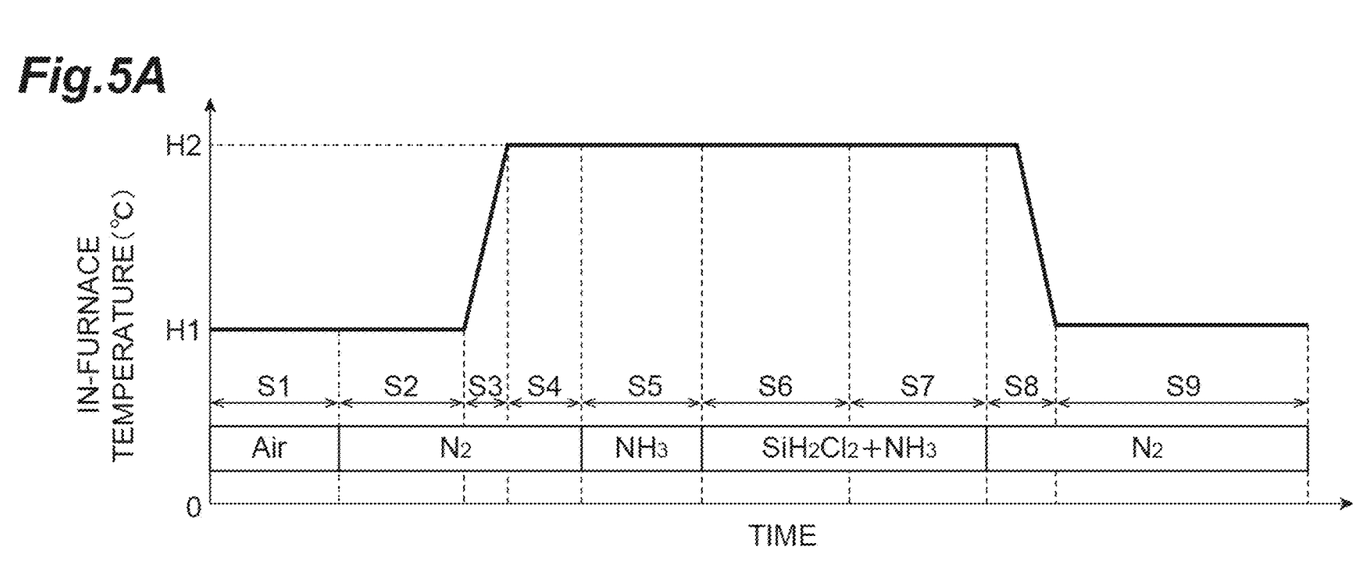
FIG. 5A is a diagram showing an in-furnace temperature and a procedure of supply gases when the insulating layer is formed.
Figure 5B:
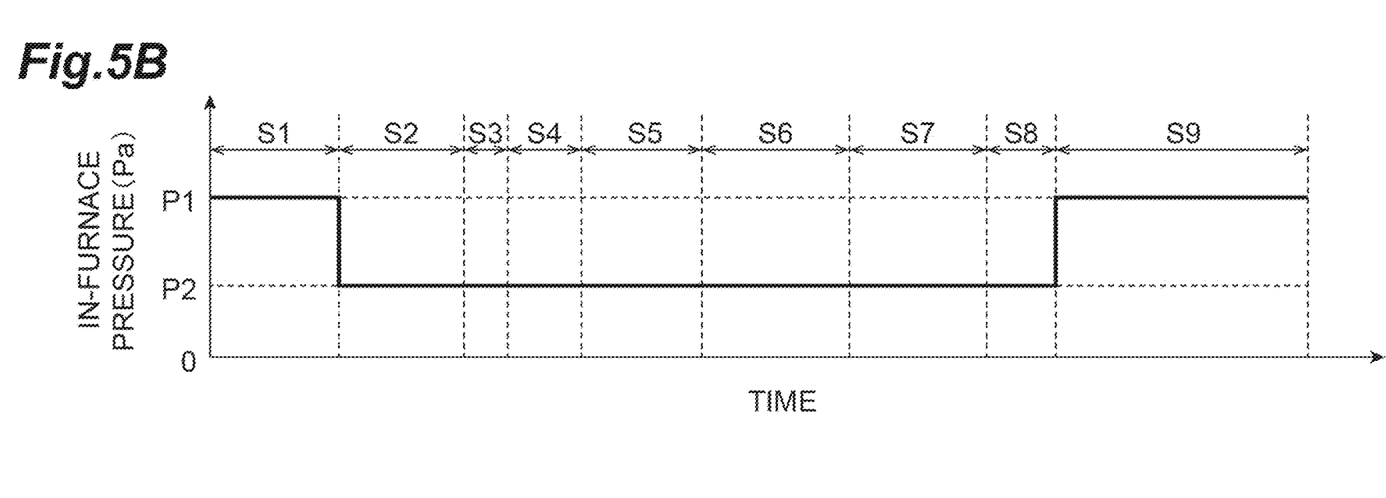
FIG. 5B is a diagram showing an in-furnace pressure when the insulating layer is formed.

Here, the details of the method of forming the insulating layer 20 using the LPCVD method will be described. FIG. 4 is a flowchart showing an example of the method of forming the insulating layer 20 using the LPCVD method. FIG. 5A is a diagram showing the temperature inside a reaction furnace (hereinafter referred to as "an in-furnace temperature") and a procedure of supply gases when the insulating layer 20 is formed. FIG. 5B is a diagram showing the pressure inside a reaction furnace (hereinafter referred to as "an in-furnace pressure") when the insulating layer 20 is formed. In FIG. 5A, the vertical axis represents the in-furnace temperature (unit: ° C.), and the horizontal axis represents time. In FIG. 5B, the vertical axis represents the in-furnace pressure (unit: Pa), and the horizontal axis represents time.

First, a wafer containing the nitride semiconductor layer 10 is introduced into the reaction furnace of a decompression CVD apparatus in an atmospheric atmosphere (step S1). At this time, the in-furnace temperature is set to a temperature H1 as shown in FIG. 5A. The temperature H1 may be, for example, room temperature (25° C.) or higher and 600° C. or lower. In an embodiment, the temperature H1 is 600° C. Next, the atmosphere in the reaction furnace is replaced (step S2). Specifically, the atmosphere in the reaction furnace is replaced with a nitrogen atmosphere by repeatedly evacuating the reaction furnace and introducing nitrogen ($N_2$) into the reaction furnace (that is, performing cycle purge). At this time, the in-furnace pressure is reduced from atmospheric pressure P1 to a pressure P2 as shown in FIG. 5B. The pressure P2 may be, for example, 20 Pa or less. In an embodiment, the pressure P2 is 20 Pa.

Subsequently, while the in-furnace pressure is maintained at the pressure P2, the in-furnace temperature is raised from the temperature H1 to a temperature H2 as shown in FIG. 5A (step S3). The temperature H2 may be, for example, 800° C. or higher. In an embodiment, the temperature H2 is 800° C. Subsequently, after the in-furnace temperature is stabilized at the temperature H2 (step S4), the nitrogen atmosphere in the reaction furnace is replaced with ammonia (step S5). Specifically, the nitrogen atmosphere in the reaction furnace is replaced with an ammonia atmosphere by repeatedly evacuating the reaction furnace and introducing ammonia into the reaction furnace.

Subsequently, a raw material gas that contains a silicon (Si)- and chlorine-containing compound gas and ammonia is supplied into the reaction furnace. The compound gas is, for example, dichlorosilane ($SiH_2Cl_2$). The compound gas only has to contain Si and Cl, and may be a gas other than dichlorosilane. In the present embodiment, the insulating layer 20 is formed by the LPCVD method using a raw material gas containing dichlorosilane and ammonia. Specifically, after forming the first SiN film 21 of the insulating layer 20 on the surface 10a using the raw material gas (step S6), the second SiN film 22 of the insulating layer 20 is subsequently formed on the first SiN film 21 using the raw material gas (step S7).

Figure 6:
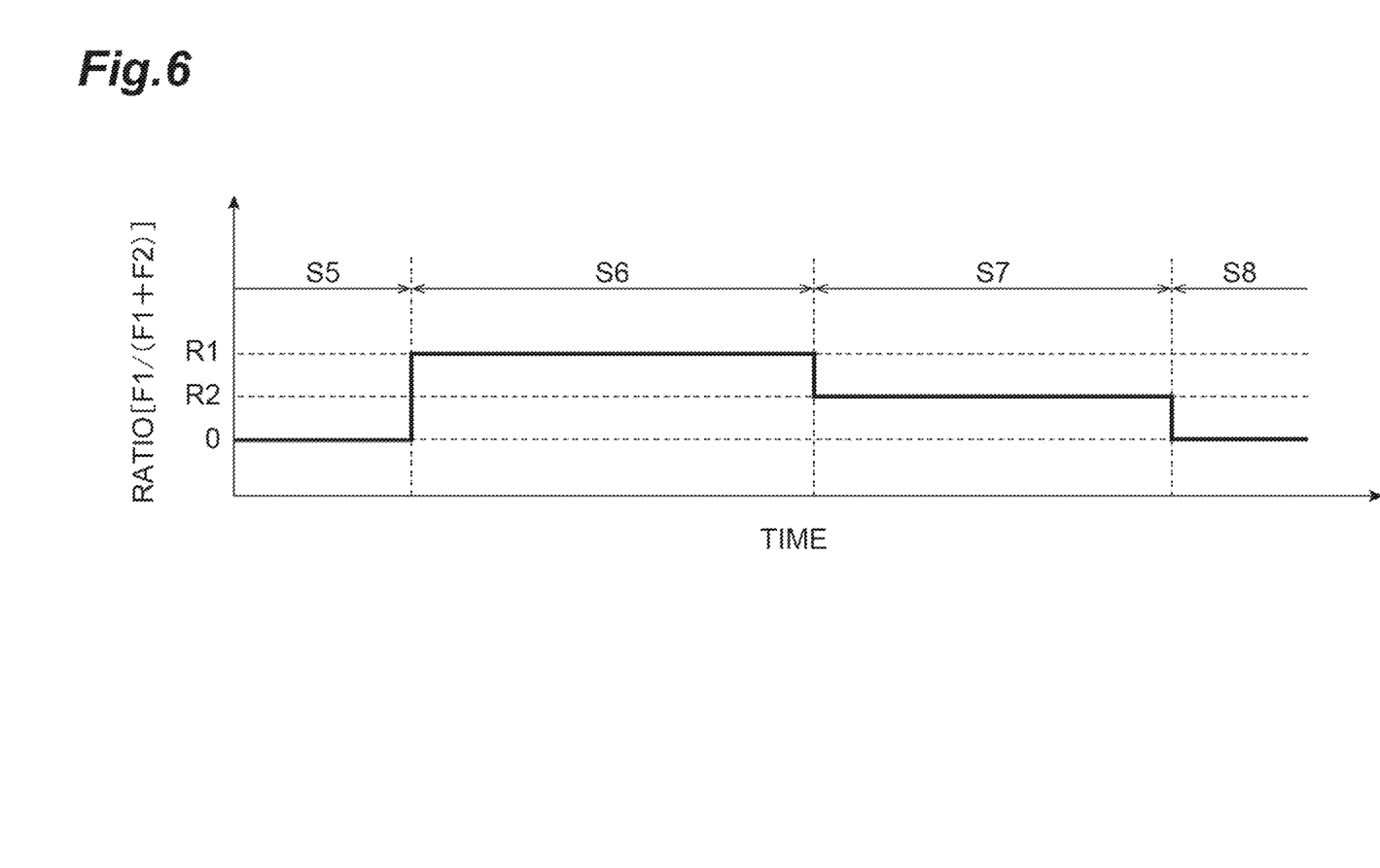
FIG. 6 is a diagram showing a flow rate ratio in a raw material gas when the insulating layer is formed.

In each of steps S6 and S7, the ratio [F1/(F1+F2)] of the flow rate (F1) of dichlorosilane to the total (F1+F2) of the flow rate (F1) of dichlorosilane and the flow rate (F2) of ammonia is adjusted. FIG. 6 shows the ratio [F1/(F1+F2)] when the insulating layer 20 is formed. In FIG. 6, the ratio [F1/(F1+F2)] in step S6 is represented as a ratio R1, and the ratio [F1/(F1+F2)] in step S7 is represented as a ratio R2. In FIG. 6, in the steps before and after steps S6 and S7, dichlorosilane is not supplied, and thus the ratio [F1/(F1+F2)] is 0.

In step S6, dichlorosilane and ammonia are supplied, and thus the ratio R1 becomes a value more than 0. In the present embodiment, the ratio R1 is 1/5 or more and 10/11 or less. When the ratio R1 is 1/5 or more and 10/11 or less, the flow rate ratio (F1/F2) of the flow rate (F1) of dichlorosilane to the flow rate (F2) of ammonia is 1/4 or more and 10 or less. In step S6, the flow rate (F1) of dichlorosilane is, for example, 50 sccm or more and 150 sccm or less, and the flow rate (F2) of ammonia is, for example, 10 sccm or more and 50 sccm or less.

On the other hand, in step S7, the ratio R2 is more than 0 and less than the ratio R1. In the present embodiment, the ratio R2 is more than 0 and 1/11 or less. When the ratio R2 is more than 0 and 1/11 or less, the flow rate ratio (F1/F2) is more than 0 and 1/10 or less. In step S7, the flow rate (F1) of dichlorosilane may be, for example, 10 sccm or more and 100 sccm or less, and the flow rate (F2) of ammonia may be, for example, 100 sccm or more and 500 sccm or less.

Figure 7:
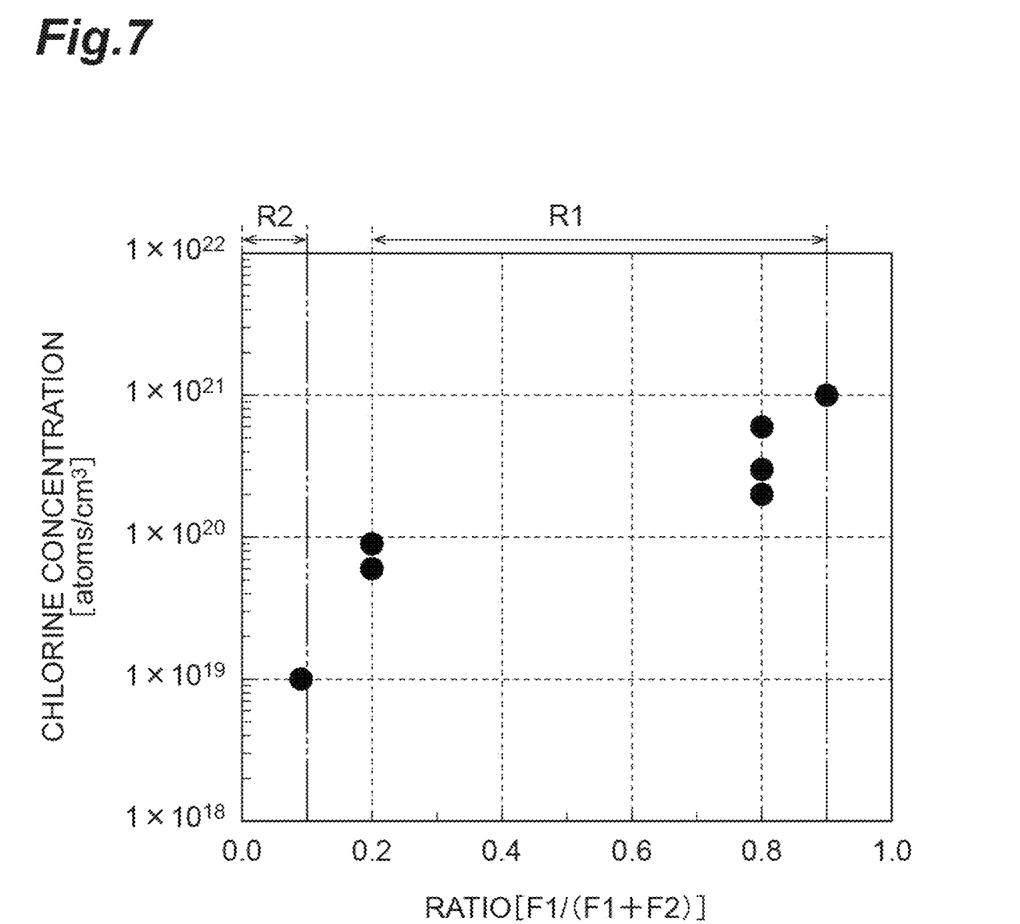
FIG. 7 is a diagram showing the relationship between the flow rate ratio in the raw material gas and a chlorine concentration.

In this way, the ratio [F1/(F1+F2)] is adjusted in each of steps S6 and S7. With this adjustment, the chlorine concentration of each of the SiN films 21 and 22 can be adjusted. FIG. 7 is a diagram showing the relationship between the ratio [F1/(F1+F2)] and the chlorine concentration. In FIG. 7, the horizontal axis represents the ratio [F1/(F1+F2)] in logarithmic representation, and the vertical axis represents the chlorine concentration of the SiN film (unit: atoms/cm$^3$).

As shown in FIG. 7, as the ratio [F1/(F1+F2)] increases, the chlorine concentration increases accordingly. In the range of the ratio R1, it is possible to increase the amount of chlorine contained in the raw material gas by increasing the flow rate (F1) of dichlorosilane containing chlorine. When the amount of chlorine contained in the raw material gas increases, the amount of chlorine taken into the first SiN film 21 increases, and the chlorine concentration of the first SiN film 21 increases. Therefore, in step S6, the first SiN film 21 having a chlorine concentration of $1 \times 10^{20}$ [atoms/cm$^3$] or more is formed.

On the other hand, in the range of the ratio R2, it is possible to decrease the amount of chlorine contained in the raw material gas by decreasing the flow rate (F1) of dichlorosilane containing chlorine. When the amount of chlorine contained in the raw material gas decreases, the amount of chlorine taken into the second SiN film 22 decreases, and the chlorine concentration of the second SiN film 22 decreases. Therefore, in step S7, the second SiN film 22 having a chlorine concentration of $1 \times 10^{19}$ [atoms/cm$^3$] or less is formed. In step S7, the second SiN film 22 may be formed using a raw material gas containing no chlorine. For example, the raw material gas may contain monosilane instead of dichlorosilane, in which case any raw material ratio can be selected as the ratio R2.

In this way, the chlorine concentration of each of the SiN films 21 and 22 can be adjusted by controlling the ratio [F1/(F1+F2)] in the raw material gas. When the chlorine concentration of each of the SiN films 21 and 22 changes, the amount of chlorine contained as an impurity in each of the SiN films 21 and 22 changes, and the refractive index of each of the SiN films 21 and 22 changes. The refractive index of the first SiN film 21 formed at the ratio R1 is, for example, 2.3 or more and 2.4 or less. On the other hand, the refractive index of the second SiN film 22 formed at the ratio R2 is, for example, 2.2 or less. The refractive indexes of the first SiN film 21 and the second SiN film 22 show the refractive index with respect to a wavelength of 632 nm.

When the flow rate of dichlorosilane containing Si increases with respect to the flow rate of ammonia containing N, the amount of Si in the raw material gas increases with respect to the amount of N. In this case, there is a concern that the amount of N in the first SiN film 21 formed at the ratio R1 will be insufficient. However, while the refractive index of Si with respect to a wavelength of 632 nm is about 3.4, the refractive index of the first SiN film 21 is 2.4 or less when actually produced. From the magnitude of this refractive index, it can be understood that the amount of N in the first SiN film 21 is sufficient (that is, it is not a Si film but a SiN film). Similarly, the second SiN film 22 formed at the ratio R2 is also formed as a SiN film instead of a Si film.

After forming the SiN films 21 and 22, the inside of the reaction furnace is replaced with a nitrogen atmosphere as shown in FIG. 5A (step S8). In step S8, a chlorine gas produced by the decomposition of dichlorosilane is diluted to the detection limit by performing cycle purge with a nitrogen gas. At this time, the in-furnace temperature is lowered from the temperature H2 to the temperature H1. After that, the in-furnace pressure is returned from the pressure P2 to atmospheric pressure P1 and the wafer is taken out of the reaction furnace (step S9). Through the above steps, the insulating layer 20 is formed on the surface 10a of the nitride semiconductor layer 10.

The effects obtained by the transistor 1 and the method of manufacturing the transistor 1 according to the present embodiment described above will be described together with the problems of the related art. When a transistor is manufactured using a nitride semiconductor, a insulating layer may be formed on a surface of a nitride semiconductor layer, and a gate opening for forming a gate electrode may be formed in the insulating layer. The gate opening is formed, for example, by highly anisotropic RIE. This RIE is carried out by applying a bias voltage to the plasma of the etching gas in the stacking direction.

In a case in which the gate opening is formed in the insulating layer using this RIE, the plasma of the etching gas collides with the surface of the nitride semiconductor layer in a high energy state due to acceleration by the bias voltage, which damages flatness of the surface. If the flatness of the surface is damaged, a Schottky barrier formed between the surface and the gate electrode will be in a state different from the ideal. Accordingly, the leakage current increases. As a result, the power consumption during operation of the transistor can increase. Therefore, in order to suppress the increase in the leakage current of such a transistor, it is desirable that the surface exposed from the gate opening have high flatness such that an atomic layer step can be visually recognized.

On the other hand, it is also conceivable to use the chemical etching to form the gate opening. As the chemical etching, for example, liquid phase etching using an HF solution or vapor phase etching using a corrosive gas (for example, a chlorine-based gas) can be considered. By such chemical etching, the surface of the nitride semiconductor layer can be flattened at an atomic level. However, since the opening width of the gate opening is required to have submicron dimensional accuracy, it is difficult to realize the dimensional accuracy of the opening width using liquid phase etching which is isotropic etching. In vapor phase etching, since the etching rate by the corrosive gas is high with respect to the outermost layer (for example, a GaN layer) of the nitride semiconductor layer, it is difficult to accurately control the etching depth, that is, the depth of the gate opening.

Regarding the above problems, in the transistor 1 according to the present embodiment, the first SiN film 21 having the chlorine concentration of $1\times10^{20}$ [atoms/cm$^3$] or more is provided on the surface 10a, and the gate opening 20c penetrating the insulating layer 20 including the first SiN film 21 is formed by RIE When the etching reaches the first SiN film 21 having the chlorine concentration of $1\times10^{20}$ [atoms/cm$^3$] or more, a small amount of chlorine is released from the first SiN film 21 into the gate opening 20c. The released chlorine chemically reacts with the surface 10a exposed from the gate opening 20c. As a result, the chemical etching with chlorine proceeds on the surface 10a.

In a case in which the cap layer 13 of the outermost layer of the nitride semiconductor layer 10 is a GaN layer, the above chemical reaction is represented by the following chemical reaction formula (1) or (2).

This chemical reaction preferentially occurs in a structurally unstable portion on the surface 10a, that is, a rough portion (an uneven portion) on the surface 10a. This chemical reaction acts on the surface 10a, and thus the surface 10a can be flattened at an atomic level. In this way, in parallel with the RIE for forming the gate opening 20c in the insulating layer 20, the chemical etching proceeds on the surface 10a exposed from the gate opening 20c, and thus the decrease of the flatness of the surface 10a caused by the RIE can be suppressed by the chemical etching. On the other hand, since the chlorine released from the first SiN film 21 does not contribute to the etching of the SiN film, it does not affect the decrease in the dimensional accuracy of the opening width and depth of the gate opening 20c.

Figure 8A:
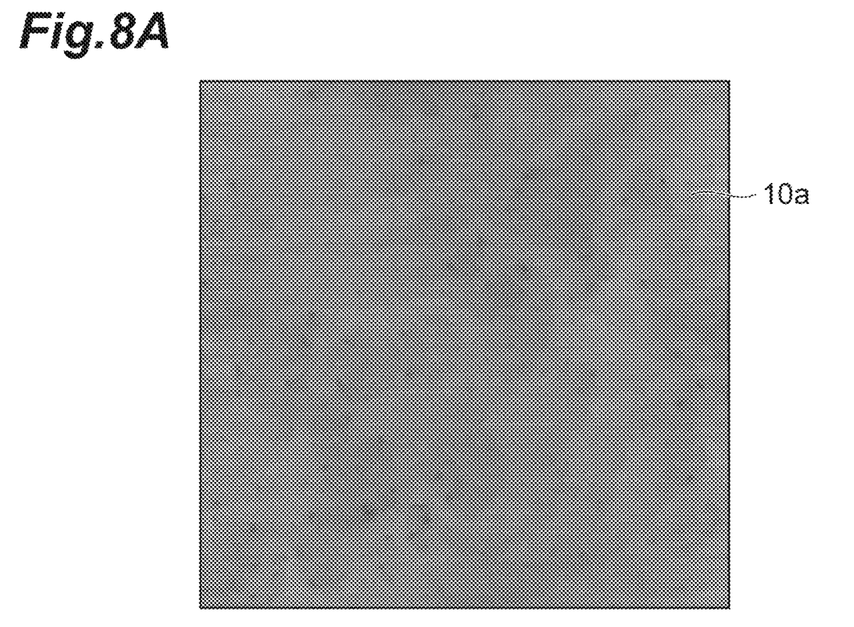
FIG. 8A is a surface image of a nitride semiconductor layer in the field effect transistor shown in FIG. 1.
Figure 8B:
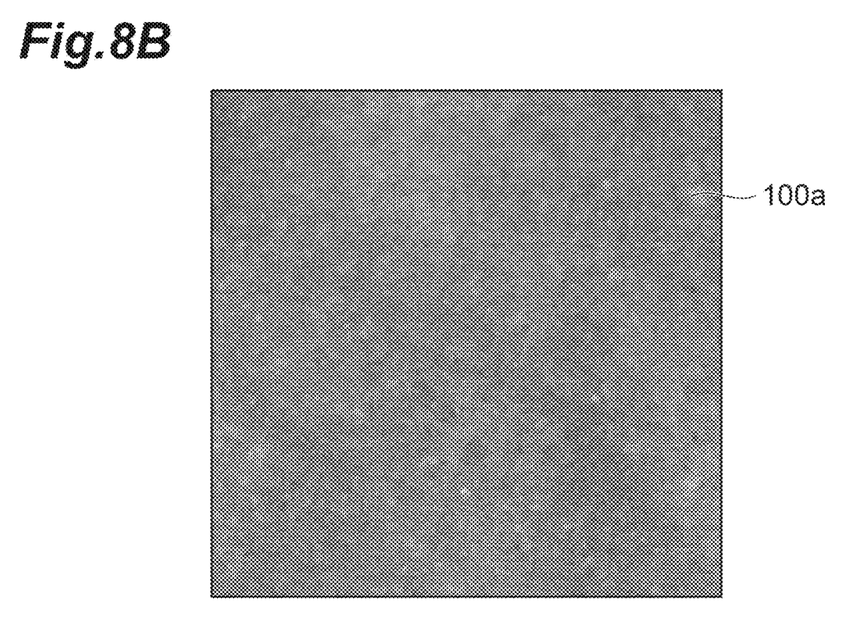
FIG. 8B is a surface image of a nitride semiconductor layer in a field effect transistor of the related art.

FIG. 8A is an image of the surface 10a of the nitride semiconductor layer 10 obtained by an atomic force microscope (AFM) after forming a gate opening 20c in the insulating layer 20 by the RIE in the transistor 1 according to the present embodiment. On the other hand, FIG. 8B is an image of a surface 100a of a nitride semiconductor layer obtained by the AFM after forming a gate opening in an insulating layer by the RIE in a transistor of the related art. In the transistor of the related art, unlike the transistor 1 according to the present embodiment, the insulating layer is constituted by only a SiN film having a chlorine concentration of $1\times10^{15}$ [atoms/cm$^3$] or less, which is below the detection limit value of the concentration measurement by the SIMS method.

As shown in FIGS. 8A and 8B, it can be understood that the surface 10a of the transistor 1 according to the present embodiment is hardly roughened as compared with the surface 100a of the transistor of the related art. In the surface 10a of the transistor 1, a step/terrace structure formed by a plurality of terraces and atomic layer steps connecting them is confirmed. When a root mean square (RMS) value representing the roughness of each surface shown in FIGS. 8A and 8B is measured, the RMS value of the surface 10a shown in FIG. 8A is 0.215 nm, and the RMS value of the surface 100a shown in FIG. 8B is 0.425 nm. In this way, according to the transistor 1 of the present embodiment, it is possible to obtain the hardly roughened surface 10a as shown in FIG. 8A, and to converge the RMS value of the surface 10a to 0.3 nm or less.

By ensuring the flatness of the surface 10a in this way, the Schottky barrier formed between the surface 10a and the gate electrode 33 can be brought closer to the ideal state. Accordingly, an increase in the leakage current can be suppressed. The present inventor has confirmed that, in a case in which the transistor 1 according to the present embodiment shown in FIG. 8A is used, the leakage current is reduced by double digits as compared with the case in which the transistor of the related art shown in FIG. 8B is used. In this way, according to the transistor 1 of the present embodiment, it is possible to suppress an increase in the leakage current. Accordingly, it is possible to suppress an increase in power consumption during the operation of the transistor 1.

The insulating layer 20 includes the second SiN film 22 provided on the first SiN film 21, and the second SiN film 22 has a chlorine concentration of $1\times10^{19}$ [atoms/cm$^3$] or less. In this way, since the insulating layer 20 includes the second SiN film 22 having a chlorine concentration of $1\times10^{19}$ [atoms/cm$^3$] or less, it is possible to suppress a situation in which chlorine is excessively contained as an impurity in the insulating layer 20. Accordingly, it is possible to suppress a decrease in the insulating property of the insulating layer 20 and to suppress an increase in the leakage current through the insulating layer 20.

As in the present embodiment, the first SiN film 21 may be located closer to the surface 10a of the nitride semiconductor layer 10 than the second SiN film 22. In this case, the first SiN film 21 having the chlorine concentration of $1 \times 10^{20}$ [atoms/cm$^3$] or more is located on the surface 10a side as compared with the second SiN film 22 having the chlorine concentration of $1 \times 10^{19}$ [atoms/cm$^3$] or less. Accordingly, chlorine released from the first SiN film 21 can be more reliably caused to act on the surface 10a, and the above-mentioned effect of suppressing a decrease in the flatness of the surface 10a can be maintained.

In the transistor 1 according to the present embodiment, an example in which the first SiN film 21 having a chlorine concentration of $1 \times 10^{20}$ [atoms/cm$^3$] or more is formed on the surface 10a of the nitride semiconductor layer 10 is shown. However, as described above, as long as the chlorine released from the first SiN film 21 can be caused to act on the surface 10a of the nitride semiconductor layer 10, even with a structure in which a third SiN film having a chlorine concentration lower than that of the first SiN film 21 is formed between the first SiN film 21 and the nitride semiconductor layer 10, similar effects can be expected.

As in the present embodiment, the ratio (T2/T1) of the thickness (T2) of the second SiN film 22 to the thickness (T1) of the first SiN film 21 may be 1 or more and 5 or less. In this case, since the ratio of the second SiN film 22 to the insulating layer 20 can be increased, it is possible to further suppress the situation in which chlorine is excessively contained as an impurity in the insulating layer 20. Accordingly, it is possible to further suppress a decrease in the insulating property of the insulating layer 20 and to further suppress an increase in the leakage current through the insulating layer 20.

As in the present embodiment, the refractive index of the first SiN film 21 may be 2.3 or more and 2.4 or less, and the refractive index of the second SiN film 22 may be 2.2 or less. The refractive index of the SiN film changes according to the change in the chlorine concentration of the SiN film. When the refractive index of the first SiN film 21 is 2.3 or more and 2.4 or less, the first SiN film 21 has a chlorine concentration of $1 \times 10^{20}$ [atoms/cm$^3$] or more. On the other hand, when the refractive index of the second SiN film 22 is 2.2 or less, the second SiN film 22 has a chlorine concentration of $1 \times 10^{19}$ [atoms/cm$^3$] or less. According to this configuration, a configuration in which the second SiN film 22 having a chlorine concentration of $1 \times 10^{19}$ [atoms/cm$^3$] or less is provided on the first SiN film 21 having a chlorine concentration of $1 \times 10^{20}$ [atoms/cm$^3$] or more can be realized. Therefore, the same effect as the above-mentioned effect can be obtained.

In the method of manufacturing the transistor 1 according to the present embodiment, the flow rate ratio (F1/F2) of the flow rate (F1) of the compound gas to the flow rate (F2) of the ammonia is set to 1/4 or more and 10 or less when the first SiN film 21 is formed. It is possible to increase the amount of chlorine contained in the raw material gas by increasing the flow rate (F1) of dichlorosilane containing chlorine. Accordingly, the first SiN film 21 having a chlorine concentration of $1 \times 10^{20}$ [atoms/cm$^3$] or more can be formed. By forming the first SiN film 21 on the surface 10a, it is possible to suppress a decrease in the flatness of the surface 10a as described above. As a result, an increase in leakage current can be suppressed, and the power consumption of the transistor 1 can be suppressed.

the flow rate ratio (F1/F2) is set to 1/10 or less when the second SiN film 22 is formed on the first SiN film 21 after the first SiN film 21 is formed on the surface 10a. In this way, it is possible to decrease the amount of chlorine contained in the raw material gas by decreasing the flow rate (F1) of dichlorosilane containing chlorine. Accordingly, the second SiN film 22 having a chlorine concentration of $1 \times 10^{19}$ [atoms/cm$^3$] or less can be formed. Further, since the insulating layer 20 includes the second SiN film 22 having a chlorine concentration of $1 \times 10^{19}$ [atoms/cm$^3$] or less, it is possible to suppress a situation in which chlorine is excessively contained as an impurity in the insulating layer 20. Accordingly, it is possible to suppress a decrease in the insulating property of the insulating layer 20 and to suppress an increase in the leakage current through the insulating layer 20. Further, since the second SiN film 22 is formed on the first SiN film 21, the first SiN film 21 having a chlorine concentration of $1 \times 10^{20}$ [atoms/cm$^3$] or more is located on the surface 10a side of the nitride semiconductor layer 10 as compared with the second SiN film 22 having a chlorine concentration of $1 \times 10^{19}$ [atoms/cm$^3$] or less. Accordingly, chlorine released from the first SiN film 21 can be more reliably caused to act on the surface 10a, and the above-mentioned effect of suppressing a decrease in the flatness of the surface 10a can be maintained.

As in the present embodiment, in the step of forming the insulating layer 20 on the surface 10a, the ratio (T2/T1) of the thickness (T2) of the second SiN film 22 to the thickness (T1) of the first SiN film 21 may be 1 or more and 5 or less. In this case, since the ratio of the second SiN film 22 to the insulating layer 20 can be increased, it is possible to further suppress the situation in which chlorine is excessively contained as an impurity in the insulating layer 20. Accordingly, it is possible to further suppress a decrease in the insulating property of the insulating layer 20 and to further suppress an increase in the leakage current through the insulating layer 20.

As in the present embodiment, in the step of forming the gate opening 20c in the insulating layer 20, the fluorine-based gas may be SF$_6$ or Cl$_4$. In this case, the gate opening 20c can be suitably formed in the insulating layer 20.

The semiconductor device and the method of manufacturing a semiconductor device according to the present disclosure are not limited to the above-described embodiments, and various other modifications are possible. For example, in the above-described embodiments, the insulating layer 25 includes the first SiN film 21 and the second SiN film 22. However, the insulating layer may contain only the first SiN film. In this case, the first SiN film may constitute the entire insulating layer. The insulating layer may contain another SiN film in addition to the first SiN film and the second SiN film.

The first SiN film may be not in contact with the surface of the nitride semiconductor layer and may be separated from the surface. In this case, the first SiN film may be provided on the surface via another film. Similarly, the second SiN film may be not in contact with the first SiN film and may be separated from the first SiN film. In this case, the second SiN film may be provided on the first SiN film via another film. The second SiN film may be a film containing no chlorine. In the above-described embodiment, an example in which the present disclosure is applied to the HEMT is shown. However, the present disclosure may be applied to transistors other than the HEMT and may be applied to semiconductor devices other than transistors (particularly, nitride semiconductor devices).

What is claimed is:

1. A semiconductor device comprising:
 a nitride semiconductor layer;
 an insulating layer provided on a surface of the nitride semiconductor layer; and
 a metal electrode in contact with the surface through an opening penetrating the insulating layer,
 wherein the insulating layer includes
 a first silicon nitride (SiN) film having a concentration of chlorine (Cl) of $1\times10^{20}$ [atoms/cm$^3$] or more and a thickness of 30 nm or less, and
 a second silicon nitride (SiN) film having a concentration of chlorine (Cl) of $1\times10^{19}$ [atoms/cm$^3$] or less.

2. The semiconductor device according to claim 1, wherein the first SiN film is located closer to the surface of the nitride semiconductor layer than the second SiN film.

3. The semiconductor device according to claim 2, wherein the first SiN film is in contact with the surface of the nitride semiconductor layer.

4. The semiconductor device according to claim 1, wherein a thickness of the second SiN film is thicker than a thickness of the first SiN film.

5. The semiconductor device according to claim 4, wherein a ratio of the thickness of the second SiN film to the thickness of the first SiN film is 1 or more and 5 or less.

6. The semiconductor device according to claim 1, wherein a refractive index of the first SiN film is 2.3 or more and 2.4 or less, and a refractive index of the second SiN film is 2.2 or less.

7. The semiconductor device according to claim 1, further comprising:
 another insulating layer provided on the insulating layer to cover the metal electrode.

* * * * *